US012689213B2

(12) United States Patent
Beaufrere

(10) Patent No.:    US 12,689,213 B2
(45) Date of Patent:        Jul. 21, 2026

(54) GRID SHIELD

(71) Applicant: CARRIER CORPORATION, Palm Beach Gardens, FL (US)

(72) Inventor: Florian Beaufrere, Rouen (FR)

(73) Assignee: CARRIER CORPORATION, Palm Beach Gardens, FL (US)

( * ) Notice:    Subject to any disclaimer, the term of this patent is extended or adjusted under 35 U.S.C. 154(b) by 563 days.

(21) Appl. No.: 18/302,931

(22) Filed:    Apr. 19, 2023

(65)              Prior Publication Data

US 2023/0344224 A1      Oct. 26, 2023

Related U.S. Application Data

(60) Provisional application No. 63/333,771, filed on Apr. 22, 2022.

(51) Int. Cl.
| | |
|---|---|
| *H02J 3/001* | (2026.01) |
| *F25D 11/00* | (2006.01) |
| *G01R 31/08* | (2020.01) |

(52) U.S. Cl.
CPC ............ *H02J 3/001* (2020.01); *F25D 11/003* (2013.01); *G01R 31/086* (2013.01); *F25D 2400/40* (2013.01)

(58) Field of Classification Search
None
See application file for complete search history.

(56)              References Cited

U.S. PATENT DOCUMENTS

2016/0154051 A1*   6/2016   Watson .............. G01R 31/1272
                                                          324/552

* cited by examiner

*Primary Examiner* — Farhana A Hoque
(74) *Attorney, Agent, or Firm* — CANTOR COLBURN LLP

(57)              ABSTRACT
A grid-shielded electrical system for a transportation refrigeration system is provided. The grid-shielded electrical system includes a bus to deliver three-phase grid power, which is received from a grid, to electrical components of the transportation refrigeration system, a voltage sensor disposed to sense a condition of voltage on the bus and configured to generate voltage readings accordingly and a controller disposed in signal communication with the voltage sensor and configured to detect a root cause issue with the grid based on the voltage readings.

18 Claims, 7 Drawing Sheets

GRID SHIELD

CROSS-REFERENCE TO RELATED APPLICATIONS

This application claims the benefit of U.S. Provisional Application No. 63/333,771 filed Apr. 22, 2022, the disclosure of which is incorporated herein by reference in its entirety.

BACKGROUND

The following description relates to transportation refrigeration units (TRUs) and, more specifically, a grid shield for use with TRUs placed on a ship during ship-wise transportation.

TRUs can be used for ship applications when deliveries of goods are required to islands or specific countries. Containers with TRUs are placed inside the ship in a closed area where diesel modes of operation are forbidden and the TRUs can only work in their standby mode with power provided by the grid. In these cases, the grid power is provided by an internal ship generator. The grid power is provided in three phases and those three phases can be unbalanced or one phase can be loose. When this happens, the corresponding TRU may shut down and, which could lead to cargo losses in the worst cases.

BRIEF DESCRIPTION

According to an aspect of the disclosure, a grid-shielded electrical system for a transportation refrigeration system is provided. The grid-shielded electrical system includes a bus to deliver three-phase grid power, which is received from a grid, to electrical components of the transportation refrigeration system, a voltage sensor disposed to sense a condition of voltage on the bus and configured to generate voltage readings accordingly and a controller disposed in signal communication with the voltage sensor and configured to detect a root cause issue with the grid based on the voltage readings.

In accordance with additional or alternative embodiments, the bus includes a three-phase bus, the voltage sensor senses the condition of voltage on each phase of the three-phase bus and the controller is configured to detect the root cause issue from at least one of an unbalanced phase and a phase loss for a predefined time for each phase of the three-phase bus based on the voltage readings.

In accordance with additional or alternative embodiments, the controller is further configured to shut down the electrical components when the root cause issue is detected and to automatically restart the electrical components once the root cause issue is no longer detected.

In accordance with additional or alternative embodiments, the grid-shielded electrical system further includes a current sensor disposed to sense a condition of current on the bus and configured to generate current readings accordingly and the controller is disposed in signal communication with the current sensor and configured to detect, in an absence of the root cause issue, a non-grid issue based on the current readings.

In accordance with additional or alternative embodiments, the bus includes a three-phase bus, the current sensor senses the condition of current on each phase of the three-phase bus and the controller is configured to detect, in the absence of the root cause issue, the non-grid issue from at least one of a low amperage condition and a sustained high amperage condition for each phase of the three-phase bus based on the current readings.

In accordance with additional or alternative embodiments, the controller is further configured to continue operations of the electrical components in the absence of the root cause issue and in an absence of the non-root cause issue.

In accordance with additional or alternative embodiments, the bus includes a three-phase bus, the voltage sensor disposed to sense a condition of voltage on each phase of the three-phase bus.

According to an aspect of the disclosure, a transportation refrigeration unit for a shipping container is provided where the shipping container is configured to be transported by a ship. The transportation refrigeration unit includes a grid-shielded electrical system. The grid-shielded electrical system includes a bus to deliver three-phase grid power, which is received from a grid of the ship, to electrical components of the transportation refrigeration system, a voltage sensor disposed to sense a condition of voltage delivered to the bus and configured to generate voltage readings accordingly and a controller disposed in signal communication with the voltage sensor and configured to detect a root cause issue with the grid based on the voltage readings. The transportation refrigeration unit is operable in a standby mode while on board the transport ship and connected to the grid, the grid exclusively powering the electrical components in the stand-by mode.

In accordance with additional or alternative embodiments, the voltage sensor is configured across multiple grid-shielded electrical systems of multiple transportation refrigeration units, each respectively including an independent bus and an independent controller, the voltage sensor disposed to sense a condition of voltage on each bus and configured to generate voltage readings accordingly.

In accordance with additional or alternative embodiments, the voltage sensor is disposed on the bus of the transportation refrigeration unit.

In accordance with additional or alternative embodiments, the voltage sensor is disposed between the bus of the transportation refrigeration unit and the grid.

In accordance with additional or alternative embodiments, the grid-shielded electrical system further includes a current sensor disposed to sense a condition of current on the bus and configured to generate current readings accordingly, the controller is disposed in signal communication with the current sensor and configured to detect, in an absence of the root cause issue, a non-grid issue based on the current readings.

According to an aspect of the disclosure, a method of operating a transportation refrigeration system including a grid-shielded electrical system is provided. The method includes delivering three-phase grid power, which is received from a grid, to electrical components of the transportation refrigeration system via a three-phase bus, sensing, with a voltage sensor, a condition of voltage on each phase of the three-phase bus and generating voltage readings accordingly and detecting, with a controller, a root cause issue with the grid based on the voltage readings.

In accordance with additional or alternative embodiments, the detecting of the root cause issue includes detecting the root cause issue from at least one of an unbalanced phase and a phase loss for a predefined time for each phase of the three-phase bus based on the voltage readings.

In accordance with additional or alternative embodiments, the method further includes sensing, with a current sensor, a condition of current on each phase of the three-phase bus and generating current readings accordingly and detecting, with a controller, in an absence of the root cause issue, detecting a non-grid issue based on the current readings.

In accordance with additional or alternative embodiments, the detecting of the non-grid issue includes detecting, in the absence of the root cause issue, the non-grid issue from at least one of a low amperage condition and a sustained high amperage condition for each phase of the three-phase bus based on the current readings.

In accordance with additional or alternative embodiments, the method further includes shutting down the electrical components when the root cause issue is detected, automatically restarting the electrical components once the root cause issue is no longer detected and continuing operations of the electrical components in the absence of the root cause issue and in an absence of the non-root cause issue.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings in which:

DETAILED DESCRIPTION

For the transportation of goods to some islands or countries, transportation by ship is often required (e.g., for transportation of goods between France and the UK or between Spain and the Canaries Islands). For these kinds of applications, containers with TRUs are used and are directly placed inside the ship in a closed area. Shipping durations can vary from as little as 2 hours or less or up to 8 hours or more.

During the transportation on the sea, the diesel mode of operation of the TRUs can be completely forbidden and so the TRUs are required to operate in their standby modes in which power for the TRUs is received as grid power from an on-board ship generator. This power is delivered as internal three-phase grid power. It has been seen, however, that the three phases of the three-phase grid power provided by the on-board ship generator can be unbalanced or, in worst case scenarios, one of the phases can be loose, which can lead to a shutdown of the TRU and potential cargo losses.

Currently, there is no way to detect an unbalanced phase or phase loss from the grid, which would help avoid the problems laid out above.

As will be described below, a three-phases voltage measurement of the grid power is sensed by a voltage sensor upstream from an alternative current (AC) sensor to detect unbalanced phase and phase loss in power supplied from the grid. The voltage sensor can be placed inside the TRU on high voltage circuits and will provide readings to the corresponding microcontroller. The readings and internal logic will allow the TRU to detect if the grid is delivering power characterized by an unbalanced phase or phase loss.

Figure 1:
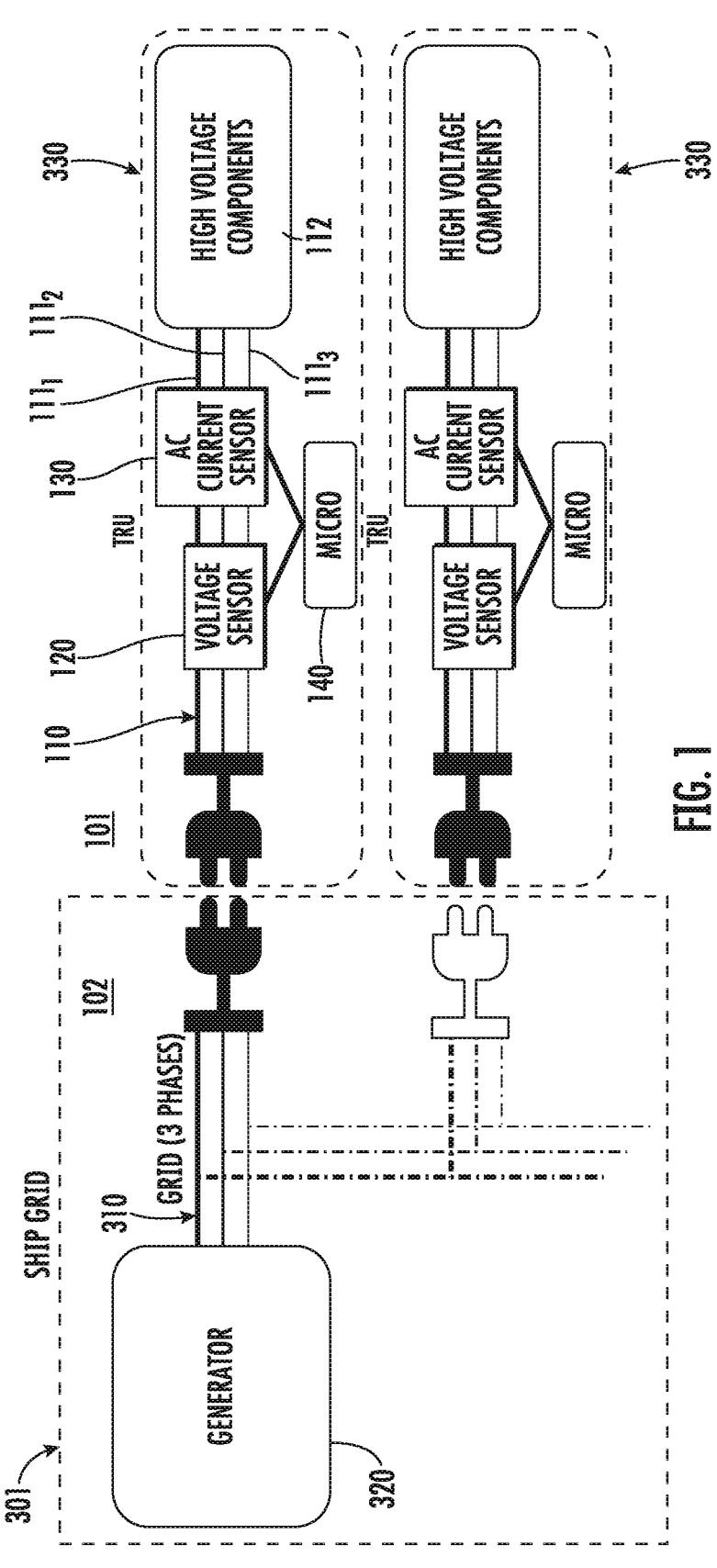
FIG. 1 is a schematic diagram of a grid-shielded electrical system with dedicated voltage sensors in accordance with exemplary embodiments.

With reference to FIG. 1, a grid-shielded electrical system 101 is provided and includes a bus (hereinafter referred to as a "three-phase bus") 110, a voltage sensor 120, a current sensor 130 (which may be optional) and a controller 140.

The three-phase bus 110 can include first, second, and third phases $111_1$, $111_2$ and $111_3$ and is disposed to deliver three-phase grid power, which is received from a grid system 102, to electrical components 112. The electrical components 112 can be high-voltage electrical components for conditioning an interior of a container (which may be referred to as a refrigerated container). The grid system 102 can be a grid of a transport ship as will be described further below.

The voltage sensor 120 is disposed to sense a condition of voltage on each of the first, second, and third phases $111_1$, $111_2$ and $111_3$ of the three-phase bus 110 and is configured to generate voltage readings accordingly. Where applicable, the current sensor 130 is disposed to sense a condition of current on each of the first, second, and third phases $111_1$, $111_2$ and $111_3$ of the three-phase bus 110 and is configured to generate current readings accordingly. The current sensor 130 may be, but is not required to be, electrically interposed between the voltage sensor 120 and the electrical components 112.

The following description will relate to the case in which the current sensor 130 is provided in the grid-shielded electrical system 101. This is being done for clarity and brevity and it is to be understood that the present application and the claims are not limited to this embodiment.

The controller 140 is disposed in signal communication with the voltage sensor 120 and with the current sensor 130. The controller 140 includes a processor, a memory unit, and a networking unit by which the processor is communicative with at least the voltage sensor 120, the current sensor 130, external devices, and user interfaces. The memory unit has executable instructions stored thereon, which are readable and executable by the processor. When the executable instructions are read and executed by the processor, the executable instructions cause the processor and by extension the controller 140 to operate as described herein.

With the controller 140 constructed as described above, the controller 140 is configured to detect a root cause issue with the grid system 102 based on the voltage readings generated by the voltage sensor 120, or, in an absence of the root cause issue, to detect a non-grid issue based on the current readings generated by the current sensor 130. In greater detail, the controller 140 is configured to detect the root cause issue from at least one of an unbalanced phase and a phase loss for a predefined time for each of the first, second, and third phases $111_1$, $111_2$, and $111_3$ of the three-phase bus 110 based on the voltage readings generated by the voltage sensor 120. The controller 140 is also configured to detect, in the absence of the root cause issue, the non-grid issue from at least one of a low amperage condition and a sustained high amperage condition for each of the first, second, and third phases $111_1$, $111_2$, and $111_3$ of the three-phase bus 110 based on the current readings generated by the current sensor 140.

The controller 140 is further configured to shut down the electrical components 112 when the root cause issue is detected and to automatically restart the electrical components 112 once the root cause issue is no longer detected (i.e., cured). The controller 140 is also further configured to continue operations of the electrical components 112 in the absence of the root cause issue and in an absence of the non-root cause issue.

Figure 2:
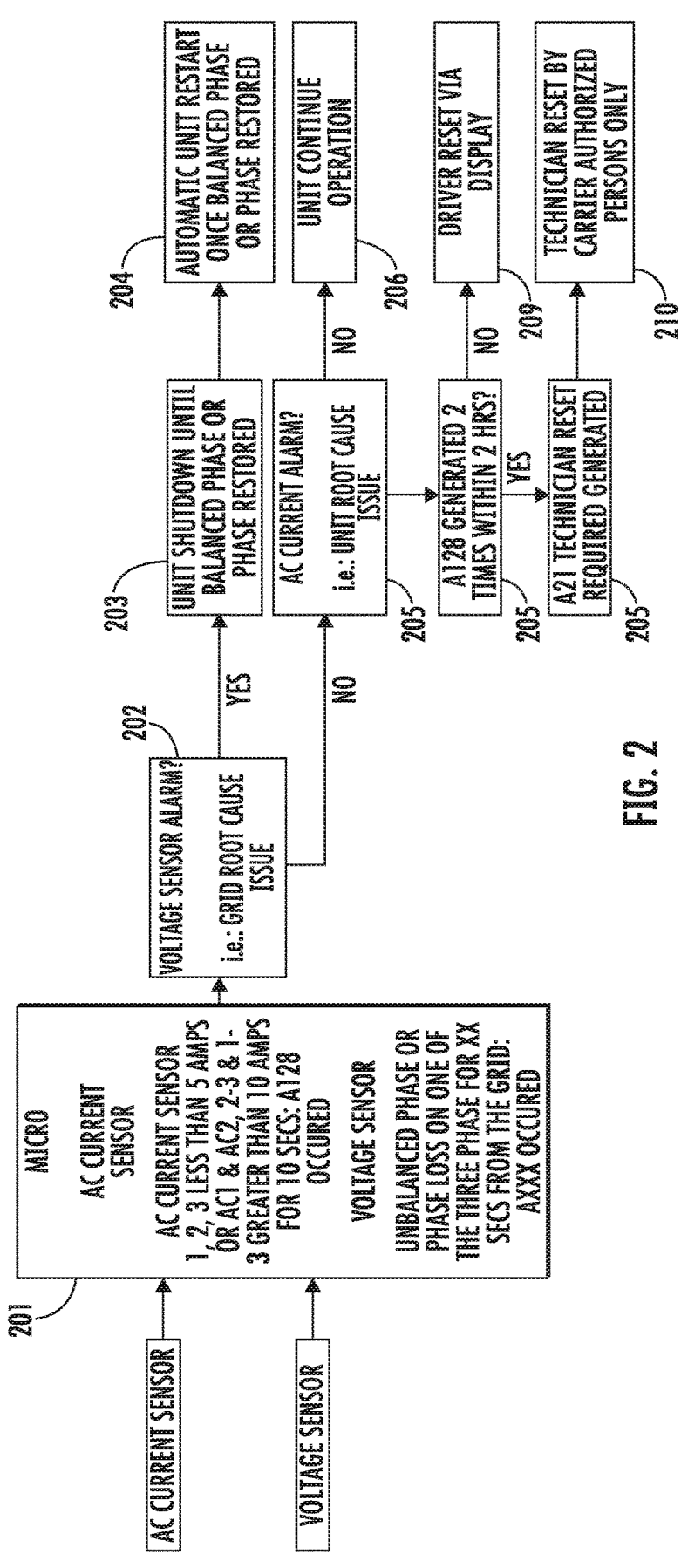
FIG. 2 is a flow diagram illustrating an operation of a controller of the grid-shielded electrical system of FIG. 1 in accordance with exemplary embodiments.
Figure 3:
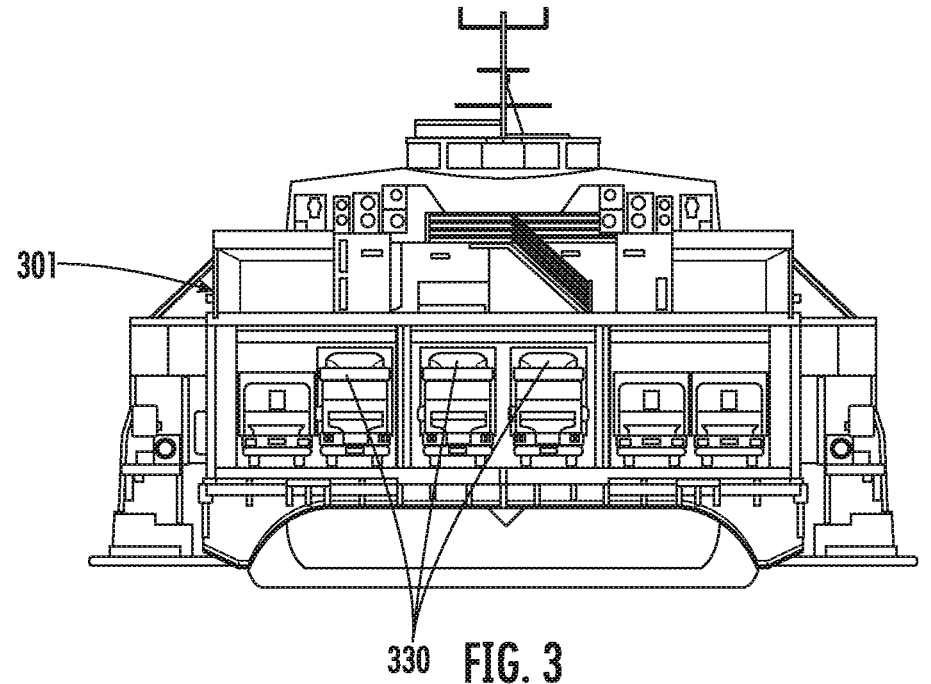
FIG. 3 is a front view of a transport ship in accordance with exemplary embodiments.

With reference to FIG. 2, the operations of the controller 140 that are described above are shown along with additional details.

The controller 140, at block 201, is initially receptive of data that is indicative of the readings of the voltage sensor 120 and the current sensor 130. At this point, the controller 140 analyzes the data of the readings of the voltage sensor 120 for evidence of the at least one of an unbalanced phase and a phase loss for a predefined time for each of the first, second, and third phases $111_1$, $111_2$, and $111_3$ of the three-phase bus 110. The controller 140 can also analyze the data of the readings of the current sensor 130 for evidence of the at least one of a low amperage condition and a sustained high amperage condition for each of the first, second, and third phases $111_1$, $111_2$, and $111_3$ of the three-phase bus 110 (this analysis of the current sensor 130 data can be delayed).

In an event that the controller 140 detects from the voltage sensor 120 data that the root cause issue with the grid system 102 is currently in effect at block 202, the controller 140 can shut down at least the electrical components 112 until the root cause issue is corrected at block 203 and can automatically restart the electrical components when the root cause issue is no longer detected at block 204. In an event that the controller 140 does not detect that the root cause issue with the grid system 102 is currently in effect at block 202, the controller 140 can then determine whether there is a non-grid (i.e., unit) issue from the current sensor 130 data at block 205. If not, the controller 140 will continue operations of the electrical components 112 at block 206. If so, the controller will determine a type of the non-grid issue at blocks 207 and 208 and take the appropriate steps accordingly at blocks 209 and 210.

With reference back to FIG. 1 and with additional reference to FIGS. 3-6, a transport ship 301 is provided. The transport ship 301 includes a three-phase grid 310 (i.e., the grid system 102) and a generator 320 to which the three-phase grid 310 is connected. The generator 320 can be configured to generate power (i.e., three-phase electrical power).

Figure 4:
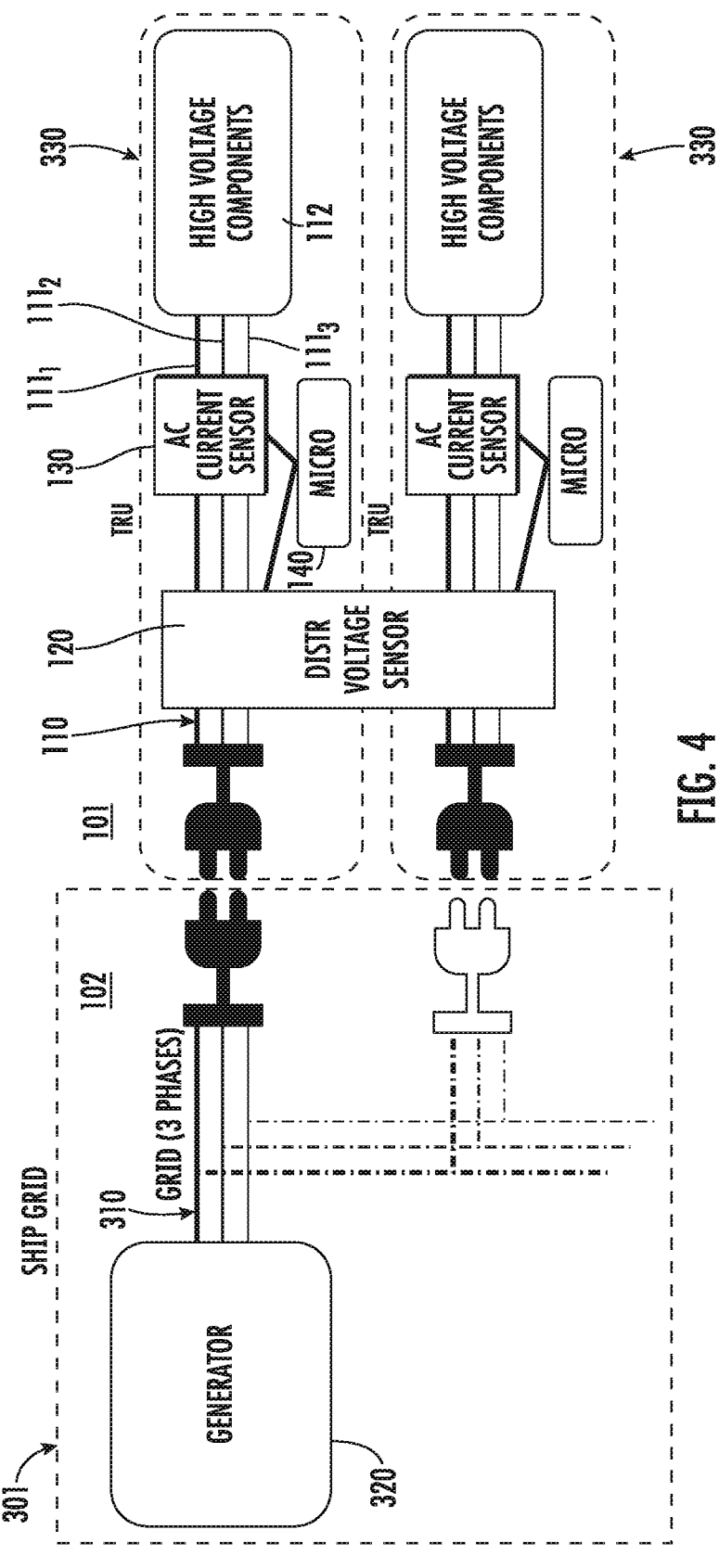
FIG. 4 is a schematic diagram of a grid-shielded electrical system with a distributed voltage sensor in accordance with exemplary embodiments.

As shown in FIGS. 1 and 4, the transport ship 301 further includes at least one TRU 330 in which the three-phase bus 110, the electrical components 112, the voltage sensor 120, the current sensor 130 and the controller 140 are provided. The at least one TRU 330 is operable in a standby mode while on board the transport ship 301 as per relevant jurisdictional requirements and is connected to the three-phase grid 310 to receive the three-phase grid power at the three-phase bus 110 for exclusively powering the electrical components 112 in the stand-by mode. In cases in which the transport ship 301 includes multiple TRUs 330, the voltage sensor 120 can be provided as multiple voltage sensors 120 that are each provided as a dedicated voltage sensor for a corresponding one of the TRUs 330 (see FIG. 1). Alternatively, in cases in which the transport ship 301 includes multiple TRUs 330, the voltage sensor 120 can be provided as a single distributed voltage sensor for each of the TRUs 330 (see FIG. 4).

Figure 5:
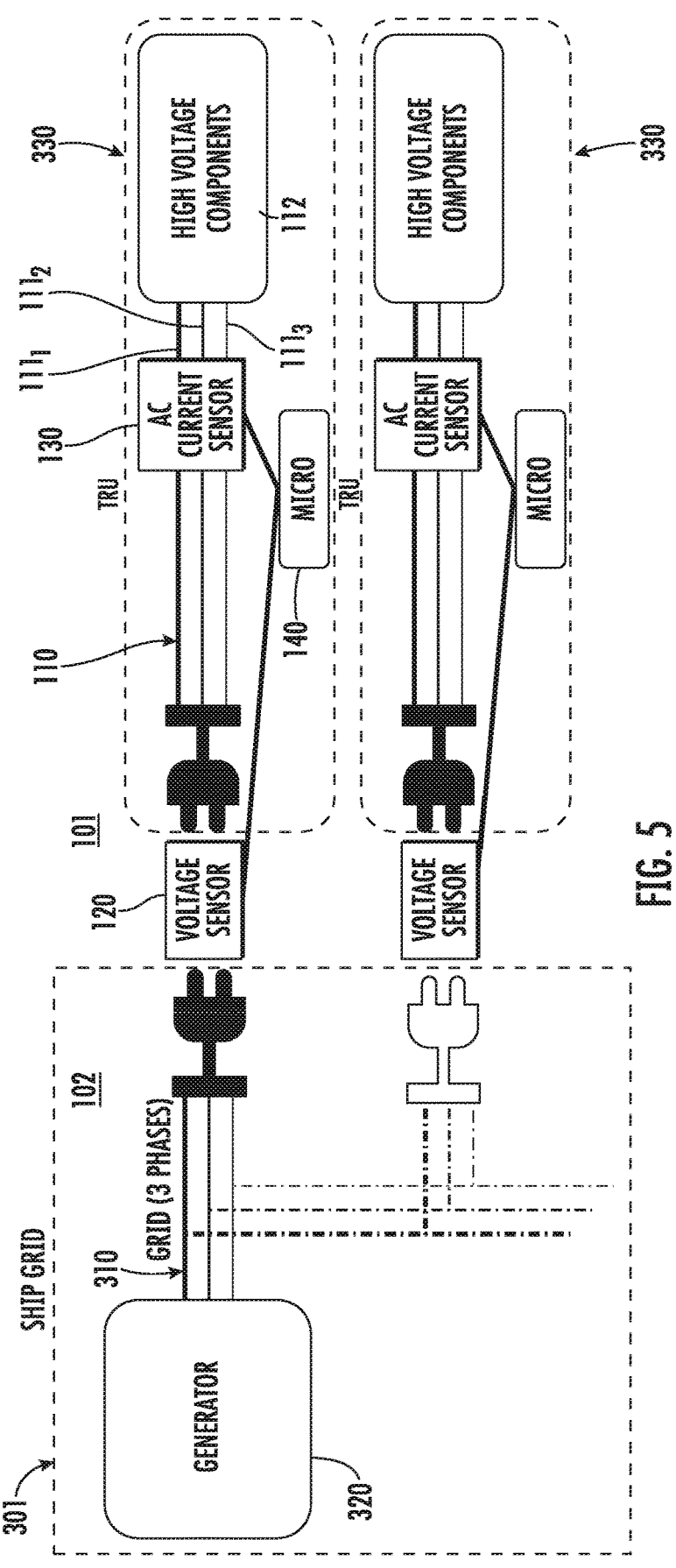
FIG. 5 is a schematic diagram of a grid-shielded electrical system with dedicated voltage sensors in accordance with alternative exemplary embodiments.
Figure 6:
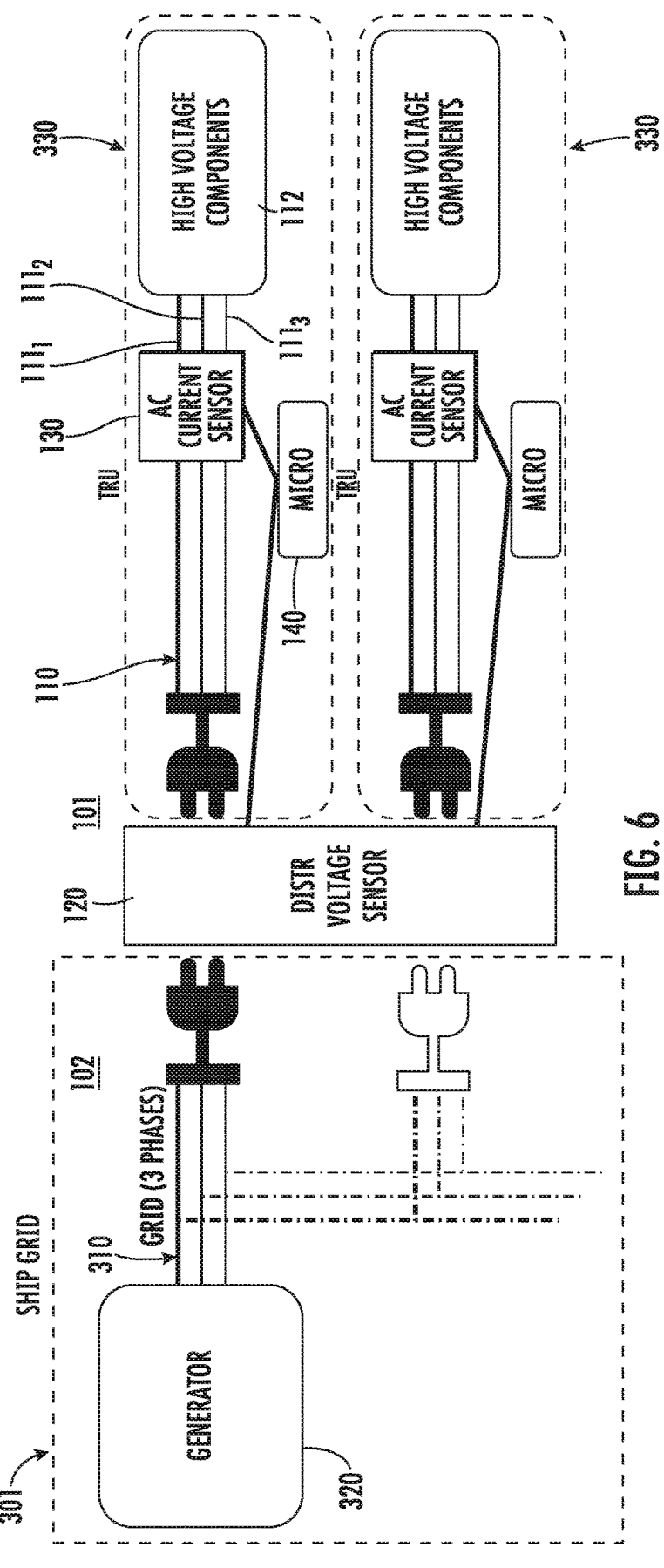
FIG. 6 is a schematic diagram of a grid-shielded electrical system with a distributed voltage sensor in accordance with alternative exemplary embodiments.

As shown in FIGS. 5 and 6, the transport sip 301 further includes at least one TRU 330 in which the three-phase bus 110, the electrical components 112, the current sensor 130 and the controller 140 are provided with the voltage sensor 120 provided externally. The at least one TRU 330 is operable in a standby mode while on board the transport ship 301 and is connected to the three-phase grid 310 to receive the three-phase grid power at the three-phase bus 110 for exclusively powering the electrical components 112 in the stand-by mode. The voltage sensor 120 is electrically interposed between the three-phase grid 310 and the at least one TRU 330. In cases in which the transport ship 301 includes multiple TRUs 330, the voltage sensor 120 can be provided as multiple voltage sensors 120 that are each provided as a dedicated voltage sensor for a corresponding one of the TRUs 330 (see FIG. 5). Alternatively, in cases in which the transport ship 301 includes multiple TRUs 330, the voltage sensor 120 can be provided as a single distributed voltage sensor for each of the TRUs 330 (see FIG. 6).

Figure 7:
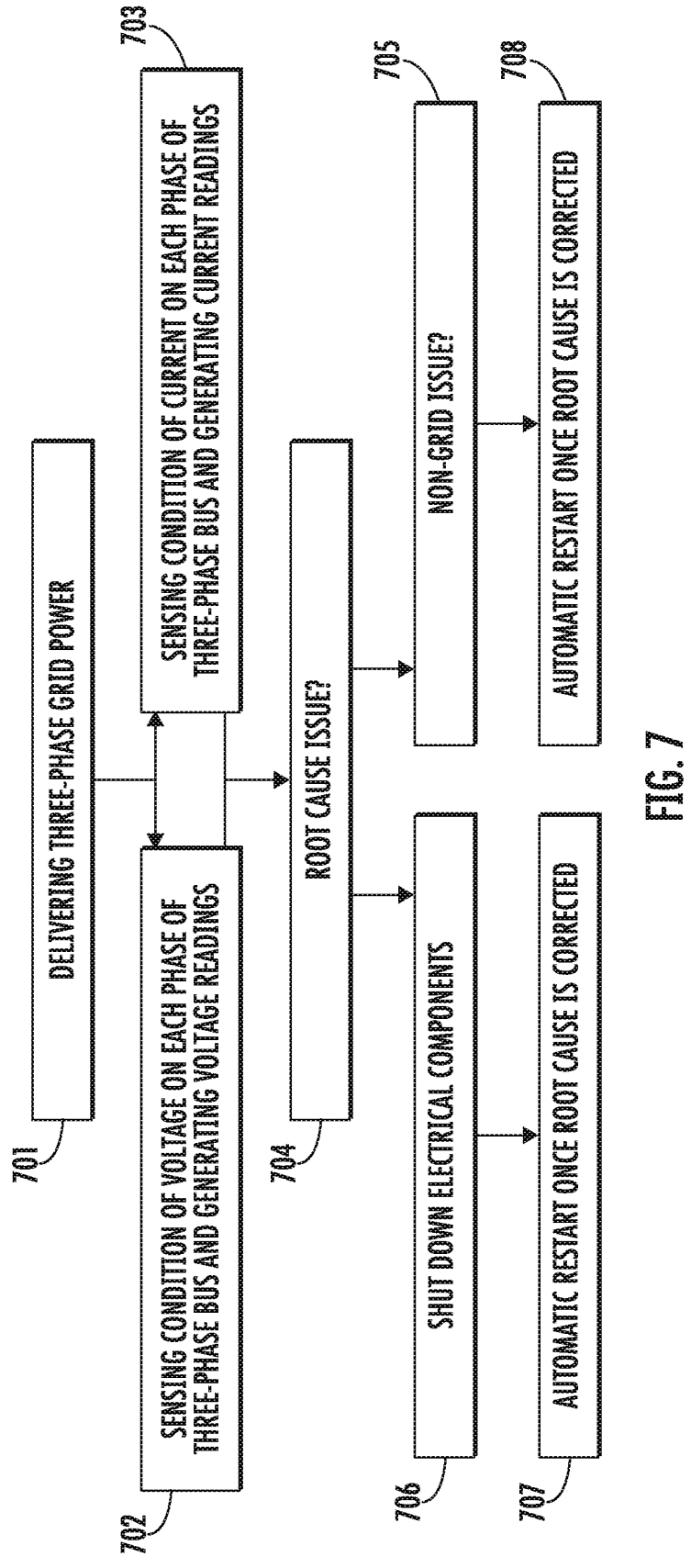
FIG. 7 is a flow diagram illustrating a method of operating a grid-shielded electrical system in accordance with exemplary embodiments.

With reference to FIG. 7, a method of operating a grid-shielded electrical system as described above is provided. As shown in FIG. 7, the method includes delivering three-phase grid power, which is received from a grid, to electrical components via a three-phase bus (block 701), sensing a condition of voltage on each phase of the three-phase bus and generating voltage readings accordingly (block 702), sensing a condition of current on each phase of the three-phase bus and generating current readings accordingly (block 703) and detecting a root cause issue with the grid based on the voltage readings (block 704), or, in an absence of the root cause issue, detecting a non-grid issue based on the current readings (block 705).

The detecting of the root cause issue of block 704 can include detecting the root cause issue from at least one of an unbalanced phase and a phase loss for a predefined time for each phase of the three-phase bus based on the voltage readings. The detecting of the non-grid issue of block 705 can include detecting, in the absence of the root cause issue, the non-grid issue from at least one of a low amperage condition and a sustained high amperage condition for each phase of the three-phase bus based on the current readings.

The method can further include shutting down the electrical components when the root cause issue is detected (block 706) and automatically restarting the electrical components once the root cause issue is no longer detected (block 707) or continuing operations of the electrical components in the absence of the root cause issue and in an absence of the non-root cause issue (block 708).

Technical effects and benefits of the present disclosure are the provision of a grid shield to detect unbalanced phase and loss phase from a grid point-of-view. While a root cause of an A128 error cannot be currently known, the grid shield will make it possible to detect the case of a grid issue itself and so avoid the problems of alarm and shutdowns. This will prevent losses of cargo and increase TRU operational time. This will also detect power source issues, prevent labor problems and increase customer satisfaction.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A grid-shielded electrical system for a transportation refrigeration system, the grid-shielded electrical system comprising:

a bus to deliver three-phase grid power, which is received from a grid, to electrical components of the transportation refrigeration system;

a voltage sensor disposed to sense a condition of voltage on the bus and configured to generate voltage readings accordingly; and a controller disposed in signal communication with the voltage sensor and configured to detect a root cause issue with the grid based on the voltage readings, wherein:

the grid-shielded electrical system further comprises a current sensor disposed to sense a condition of current on the bus and configured to generate current readings accordingly, and the controller is disposed in signal communication with the current sensor and configured to detect, in an absence of the root cause issue, a non-grid issue based on the current readings.

2. The grid-shielded electrical system according to claim 1, wherein:

the bus comprises a three-phase bus, the voltage sensor senses the condition of voltage on each phase of the three-phase bus, and the controller is configured to detect the root cause issue from at least one of an unbalanced phase and a phase loss for a predefined time for each phase of the three-phase bus based on the voltage readings.

3. The grid-shielded electrical system according to claim 1, wherein the controller is further configured to shut down the electrical components when the root cause issue is detected and to automatically restart the electrical components once the root cause issue is no longer detected.

4. The grid-shielded electrical system according to claim 1, wherein:

the bus comprises a three-phase bus, the current sensor senses the condition of current on each phase of the three-phase bus, and the controller is configured to detect, in the absence of the root cause issue, the non-grid issue from at least one of a low amperage condition and a sustained high amperage condition for each phase of the three-phase bus based on the current readings.

5. The grid-shielded electrical system according to claim 1, wherein the controller is further configured to continue operations of the electrical components in the absence of the root cause issue and in an absence of the non-root cause issue.

6. The grid-shielded electrical system according to claim 1, wherein the bus comprises a three-phase bus, the voltage sensor disposed to sense a condition of voltage on each phase of the three-phase bus.

7. A transportation refrigeration unit for a shipping container, the shipping container configured to be transported by a ship, the transportation refrigeration unit comprising:

a grid-shielded electrical system, the grid-shielded electrical system comprising:

a bus to deliver three-phase grid power, which is received from a grid of the ship, to electrical components of the transportation refrigeration system;

a voltage sensor disposed to sense a condition of voltage delivered to the bus and configured to generate voltage readings accordingly; and a controller disposed in signal communication with the voltage sensor and configured to detect a root cause issue with the grid based on the voltage readings, wherein the transportation refrigeration unit is operable in a standby mode while on board the transport ship and connected to the grid, the grid exclusively powering the electrical components in the stand-by mode, and wherein:

the grid-shielded electrical system further comprises a current sensor disposed to sense a condition of current on the bus and configured to generate current readings accordingly from at least one of a low amperage condition and a sustained high amperage condition for each phase of the three-phase bus based on the current readings, and the controller is disposed in signal communication with the current sensor and configured to detect, in an absence of the root cause issue, a non-grid issue based on the current readings from the at least one of the low amperage condition and the sustained high amperage condition for each phase of the three-phase bus based on the current readings.

8. The transportation refrigeration unit according to claim 7, wherein the voltage sensor is configured across multiple grid-shielded electrical systems of multiple transportation refrigeration units, each respectively comprising an independent bus and an independent controller, the voltage sensor disposed to sense a condition of voltage on each bus and configured to generate voltage readings accordingly.

9. The transportation refrigeration unit according to claim 7, wherein the voltage sensor is disposed on the bus of the transportation refrigeration unit.

10. The transportation refrigeration unit according to claim 7, wherein the voltage sensor is disposed between the bus of the transportation refrigeration unit and the grid.

11. A grid-shielded electrical system for a transportation refrigeration system, the grid-shielded electrical system comprising:

a current sensor disposed to sense a condition of current on a bus configured to deliver a three-phase grid power, wherein the current sensor is further configured to generate current readings; and a controller disposed in signal communication with the current sensor, the controller being configured to detect, in an absence of a root cause issue, a non-grid issue based on the current readings.

12. A method of operating a transportation refrigeration system comprising the grid-shielded electrical system according to claim 11, the method comprising:

delivering the three-phase grid power, which is received from a grid, to electrical components of the transportation refrigeration system via the three-phase bus;

sensing, with a voltage sensor, a condition of voltage on each phase of the three-phase bus and generating voltage readings accordingly; and detecting, with the controller, the root cause issue with the grid based on the voltage readings.

13. The method according to claim 12, wherein the detecting of the root cause issue comprises detecting the root cause issue from at least one of an unbalanced phase and a phase loss for a predefined time for each phase of the three-phase bus based on the voltage readings.

14. The method according to claim 12, wherein the detecting of the non-grid issue comprises detecting, in the absence of the root cause issue, the non-grid issue from at least one of a low amperage condition and a sustained high amperage condition for each phase of the three-phase bus based on the current readings.

15. The method according to claim 12, further comprising:

shutting down the electrical components when the root cause issue is detected;

automatically restarting the electrical components once the root cause issue is no longer detected; and continuing operations of the electrical components in the absence of the root cause issue and in an absence of the non-root cause issue.

16. The grid-shielded electrical system according to claim 11, wherein the bus is configured to deliver the three-phase grid power from a grid to electrical components of the transportation refrigeration system.

17. The grid-shielded electrical system according to claim 11, wherein the grid-shielded electrical system further comprises a voltage sensor disposed to sense a condition of voltage on the bus and configured to generate voltage readings accordingly.

18. The grid-shielded electrical system according to claim 11, wherein the controller is further disposed in signal communication with a voltage sensor and configured to detect the root cause issue with the grid based on the voltage readings.

* * * * *